United States Patent
Wu et al.

(10) Patent No.: US 12,235,313 B2
(45) Date of Patent: Feb. 25, 2025

(54) COMPOSITE INTERMEDIARY DEVICE USING VERTICAL PROBE FOR WAFER TESTING

(71) Applicant: SYU GUANG TECHNOLOGY CO., LTD., Zhubei (TW)

(72) Inventors: Kun Yu Wu, Zhubei (TW); Ming Tsung Tsai, Taoyuan (TW)

(73) Assignee: SYU GUANG TECHNOLOGY CO., LTD., Zhubei (TW)

( * ) Notice: Subject to any disclaimer, the term of this patent is extended or adjusted under 35 U.S.C. 154(b) by 177 days.

(21) Appl. No.: 18/301,481

(22) Filed: Apr. 17, 2023

(65) Prior Publication Data

US 2024/0151764 A1 May 9, 2024

(30) Foreign Application Priority Data

Nov. 3, 2022 (TW) .................................. 111142022

(51) Int. Cl.
*G01R 31/26* (2020.01)
*G01R 1/073* (2006.01)

(52) U.S. Cl.
CPC ..... *G01R 31/2601* (2013.01); *G01R 1/07314* (2013.01)

(58) Field of Classification Search
CPC ............ G01R 31/2601; G01R 1/07314; G01R 1/0491; G01R 1/07378
See application file for complete search history.

(56) References Cited

U.S. PATENT DOCUMENTS

| 2017/0336442 | A1* | 11/2017 | Nishimura | ......... G01R 1/07314 |
| 2020/0271693 | A1* | 8/2020 | Ahn | ..................... G01R 1/07378 |
| 2023/0021227 | A1* | 1/2023 | Crippa | ................ G01R 1/06744 |

\* cited by examiner

*Primary Examiner* — Giovanni Astacio-Oquendo
(74) *Attorney, Agent, or Firm* — Birch, Stewart, Kolasch & Birch, LLP

(57) ABSTRACT

A composite intermediary device using vertical probe for wafer testing, comprising: a printed circuit board, a glass interposer and a vertical probe set; wherein the printed circuit board has printed circuit connected with a measuring apparatus, the glass interposer has multiple contact pads connected with the printed circuit, and then the probes of the vertical probe set are against the contact pads of the glass interposer and the bumps of the device under test. By a fine pitch configuration of the printed circuit and the contact pads of the glass interposer, the present invention achieves the requirements of synchronous and interleaved testing of multiple ICs.

8 Claims, 15 Drawing Sheets

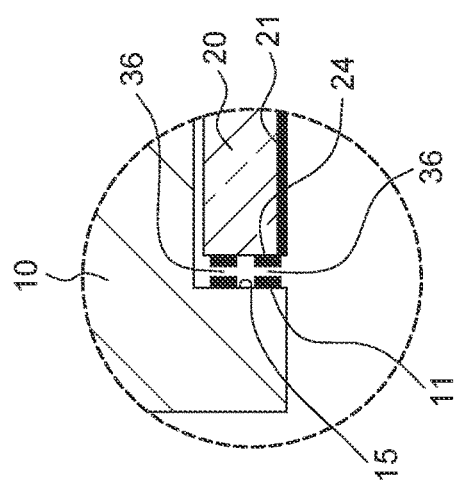
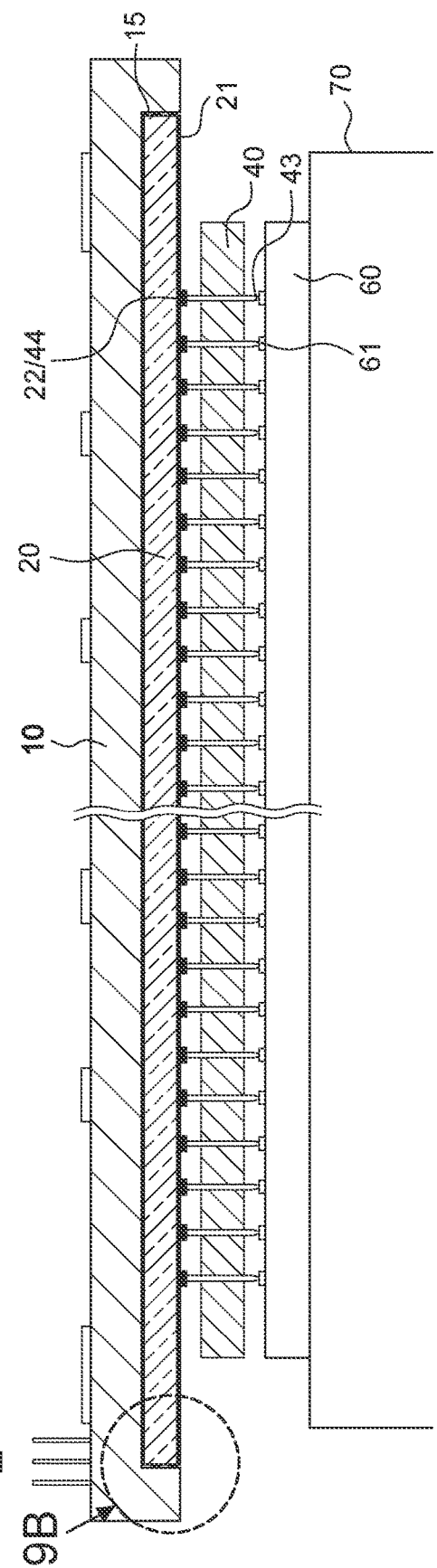

COMPOSITE INTERMEDIARY DEVICE USING VERTICAL PROBE FOR WAFER TESTING

BACKGROUND OF THE INVENTION

1. Field of the Invention

The invention relates to a wafer testing device, especially to one that uses a fine pitch configuration of the printed circuit and the contact pads of the glass interposer for achieving a composite intermediary device using vertical probe for wafer testing to do synchronous and interleaved testing of multiple ICs.

2. Description of the Related Art

When doing the general wafer test, the test signal needs to be input into the integrated circuit of the device under test, DUT; First, using a plurality of tiny probes in the probe card contact to the bumps of the DUT, and send test signals from the test machine to connect the integrated circuit through the probes and bumps; after the test signal is processed by the integrated circuit, it is fed back to the test machine through the probes, and finally the test machine will analyze the signal fed back to achieve the wafer test result.

As shown in FIG. 1A, a conventional probe test device 1200; including a probe interface board 1210, a pogo tower 1220 and a probe card 1230; wherein the test signal is transmitted to the probe interface board 1210, then transmitted to the pogo tower 1220, then transmitted to the probe 1231 of the probe card 1230, and finally transmitted to the DUT 1240; Since the test signal of the probe test device 1200 needs to go through a long transmission path, the test signal will be attenuated, thereby causing test errors.

As shown in FIG. 1B, a conventional probe test device 1300; including a probe interface board 1310, a space transformer 1320 and a probe card 1330; wherein the probe interface board 1310 and the space transformer 1320 are electrically connected by solder paste 1340; moreover, the conventional probe test device 1300 includes a guide plate 1331 and multiple vertical probes 1332, the guide plate 1331 is secured below the space transformer 1320, the vertical probes 1332 set through the guide plate 1331 and are electrically connected to the space transformer 1320 for transmitting the test signal to the DUT 1350; Since the probe test device 1300 is a direct-docking type, the signal transmission path is relatively short; because the probe interface board 1310 and the space transformer 1320 are connected by solder paste 1340, during the reflow soldering, the probe interface board 1310 is easily damaged due to high temperature.

As shown in FIG. 1C, a conventional probe test device 1400; including a probe interface board 1410, a space transformer 1420, a positioning frame 1430, a support plate 1440, a plurality of electrical contacts 1450 and a probe card set 1460; wherein the support plate 1440 is arranged between the probe interface board 1410 and the space transformer 1420, the electrical contacts 1450 are arranged at the support plate 1440, and the positioning frame 1430 against on the space transformer 1420, so as to make sure the electrical contacts 1450 and the space transformer 1420 having nice electric contact to transmitting test signal to the DUT 1470; since the probe test device 1400 does not required reflow soldering to make connection, therefore the probe interface board 1310 will not be damaged due to high temperature; however, due to the elastic force exerted by the electrical contacts 1450, the space transformer 1420 will be greatly deformed, so that the probe card set 1460 cannot make precise contact with the DUT 1470.

Because wafer testing helps to improve the process efficiency of wafer processing, thereby improving the yield rate of wafer processing, and at the same time ensuring the effectiveness of subsequent packaging operations; therefore, in the probe testing device, the aforementioned disadvantages of conventional mechanisms have to be solved, including how to shorten the transmission path of test signals, how to avoid damage to related components due to high temperature, and how to ensure precise contact between the probe and the device under test, thereby improving the quality of wafer testing.

SUMMARY OF THE INVENTION

It is a primary objective of the present invention to provide a composite intermediary device using vertical probe for wafer testing to achieve fine pitch operation of wafer testing.

It is another objective of the present invention to provide a composite intermediary device using vertical probe for wafer testing to achieve synchronous and interleaved testing of multiple ICs.

In order to achieve the above objectives, the present invention including: a printed circuit board, having a testing circuit, for connecting to a measuring apparatus, the bottom of the printed circuit board has a first contact; a glass interposer arranged below the printed circuit board, the surface of the glass interposer has a printed circuit and multiple contact pads, a second contact which connects with the printed circuit, and the first contact of the printed circuit board is connected to the second contact of the glass interposer; a vertical probe set, the vertical probe set has a guide plate, the guide plate having multiple via holes for arranging the probes, and top end of each probe has a salient point connect to the contact pad.

Whereby when doing the test, the composite intermediary device of the present invention moves downward, and the plurality of probes of the vertical probe set will touch the bumps of the device under test; at this time, the measuring apparatus will send a test voltage enters the integrated circuit inside the device under test through the probes and bumps. After the test voltage is processed by the integrated circuit, it is fed back to the measuring apparatus for analysis and judgment, then repeat the operation to achieve the test operation of the DUT.

Also, the present invention further includes at least one flexible connecting plate, one end has a top connecting end to connect the first contact, the other end has a bottom connecting end to connect the second contact, between the top connecting end and the bottom connecting end have multiple transmission lines, so as to make the first contact of the printed circuit board and the second contact of the glass interposer connect to each other.

Also, the upper surface of the glass interposer has a printed circuit and multiple contact pads on the lower surface, having multiple through holes set through the upper surface and the lower surface, and through holes are filled with a conductive material, so as to electrically connect the printed circuit and the contact pads.

Also, the present invention further includes a buffer unit made of insulating material, which is arranged between the printed circuit board and the glass interposer to block the contact between the printed circuit board and the glass interposer.

Also, the bottom of the printed circuit board has a groove, and the glass interposer is secured in the groove of the printed circuit board.

Also, the printed circuit and multiple contact pads are arranged at the lower surface of the glass interposer, the first contact is arranged at one side of the groove of the printed circuit board, the second contact corresponds to the first contact arranged at the lateral side of the glass interposer, and the first contact and the second contact are joined by laser welding.

Also, the printed circuit and multiple contact pads are arranged on the lower surface of the glass interposer, and the first contact is arranged at the bottom of the printed circuit board adjacent to the groove, the second contact is arranged at the bottom of the glass interposer corresponding to the first contact, and the first contact and the second contact are electrically connected by coating a solder paste or an anisotropic conductive adhesive film.

Also, the printed circuit and multiple contact pads are respectively arranged on the upper surface and the lower surface of the glass interposer, multiple through holes set through the upper surface and the lower surface, and the through holes are filled with a conductive material, so as to electrically connect the printed circuit and the contact pads, the first contact is arranged on the top of the groove of the printed circuit board, the second contact is arranged on the top of the glass interposer corresponding to the first contact, and the first contact and the second contact are electrically connected by coating a solder paste or an anisotropic conductive adhesive film and laser welding.

With the feature disclosed above, the composite intermediary device of the present invention, there are a printed circuit board, a glass interposer, and a vertical probe set in sequence from top to bottom; wherein the glass interposer has multiple contact pads arranged at the bottom, the number and the positions of the contact pads corresponds to the number of probes, and the number and the positions of the probes correspond to the bumps of the DUT; when doing the test, the composite intermediary device moves downward, and the plurality of probes of the vertical probe set will touch the bumps of the DUT; at this time, the measuring apparatus will send a test voltage enters the integrated circuit inside the device under test by passing through the first contact, the second contact, the printed circuit, the contact pads, the probes and bumps. After the test voltage is processed by the integrated circuit, it is fed back to the measuring apparatus for analysis and judgment, then repeat the operation to achieve the test operation of the DUT.

By a fine pitch configuration of the printed circuit and the contact pads of the glass interposer, the present invention achieves the requirements of synchronous and interleaved testing of multiple ICs.

BRIEF DESCRIPTION OF THE DRAWINGS

FIG. 9A is a schematic diagram illustrating the second joint type of the third embodiment of the present invention FIG. 9B is a zoom-in of the second join type of the present invention;

DETAILED DESCRIPTION OF THE PREFERRED EMBODIMENT

Figure 1A:
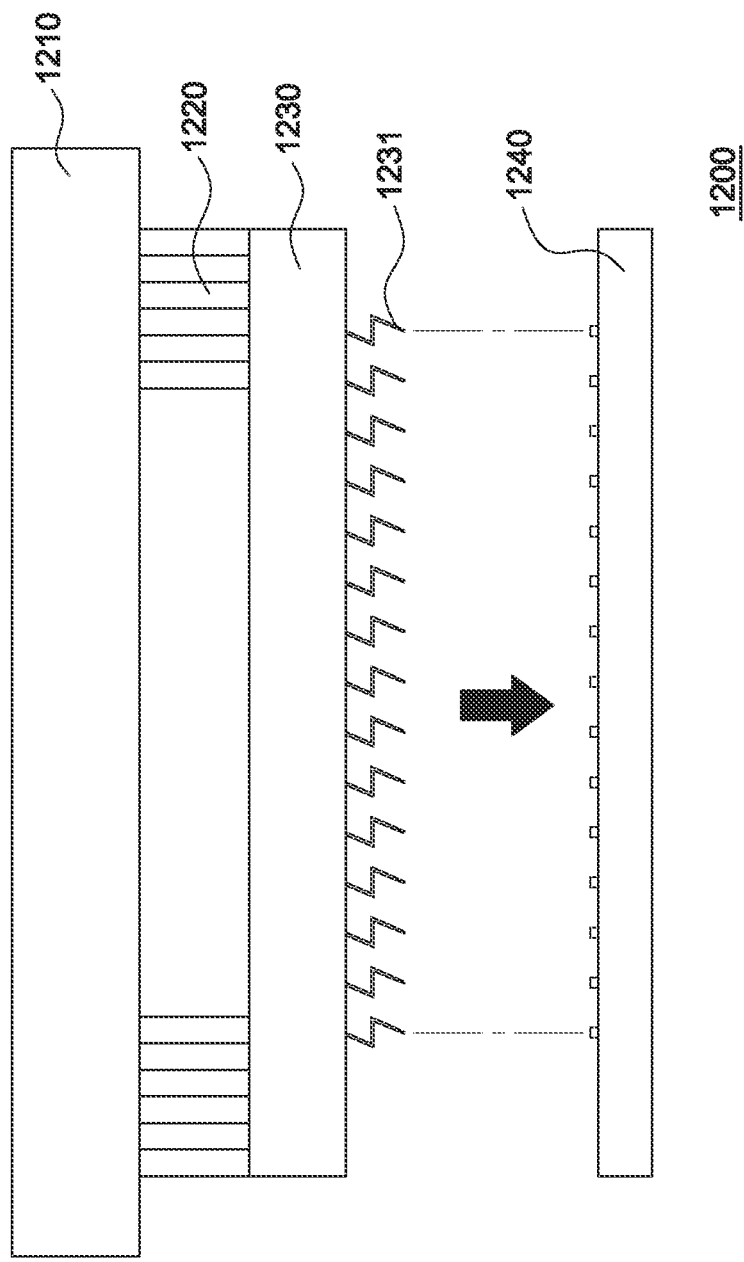
FIG. 1A is a schematic diagram illustrating the structure of a conventional probe test device of the prior art.
Figure 1B:
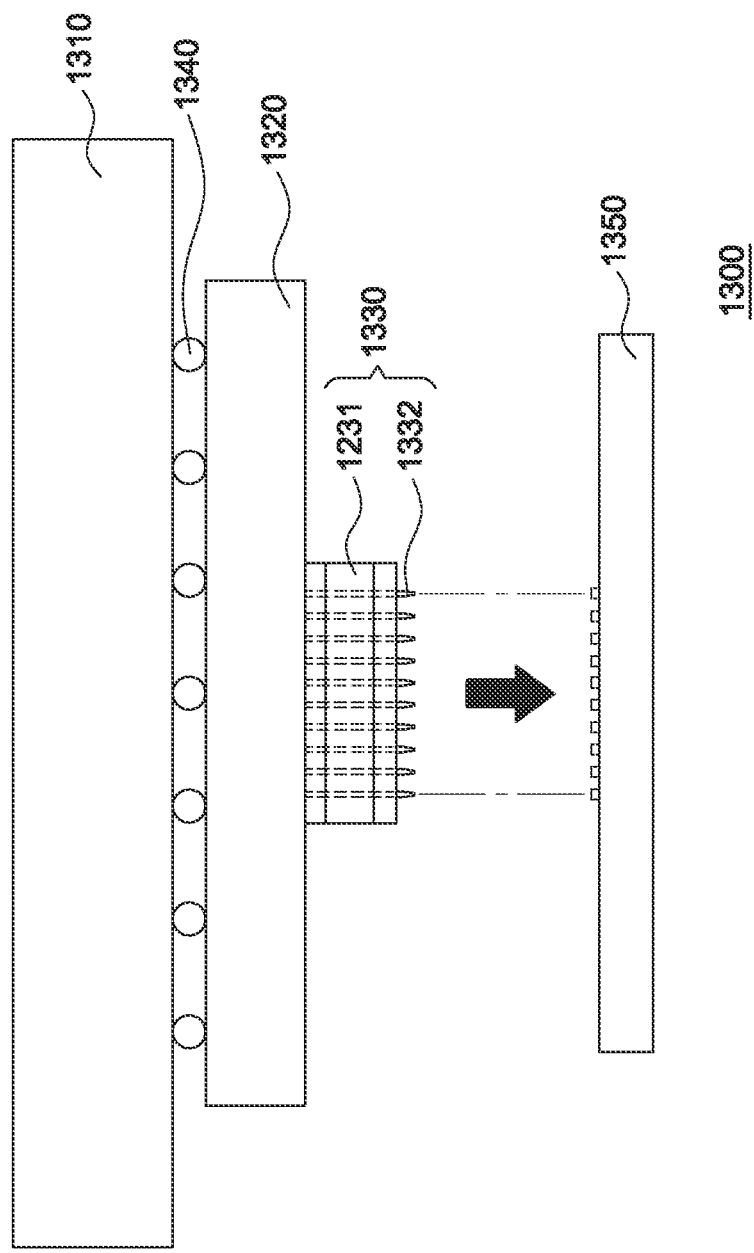
FIG. 1B is a schematic diagram illustrating the structure of another conventional probe test device of the prior art.
Figure 1C:
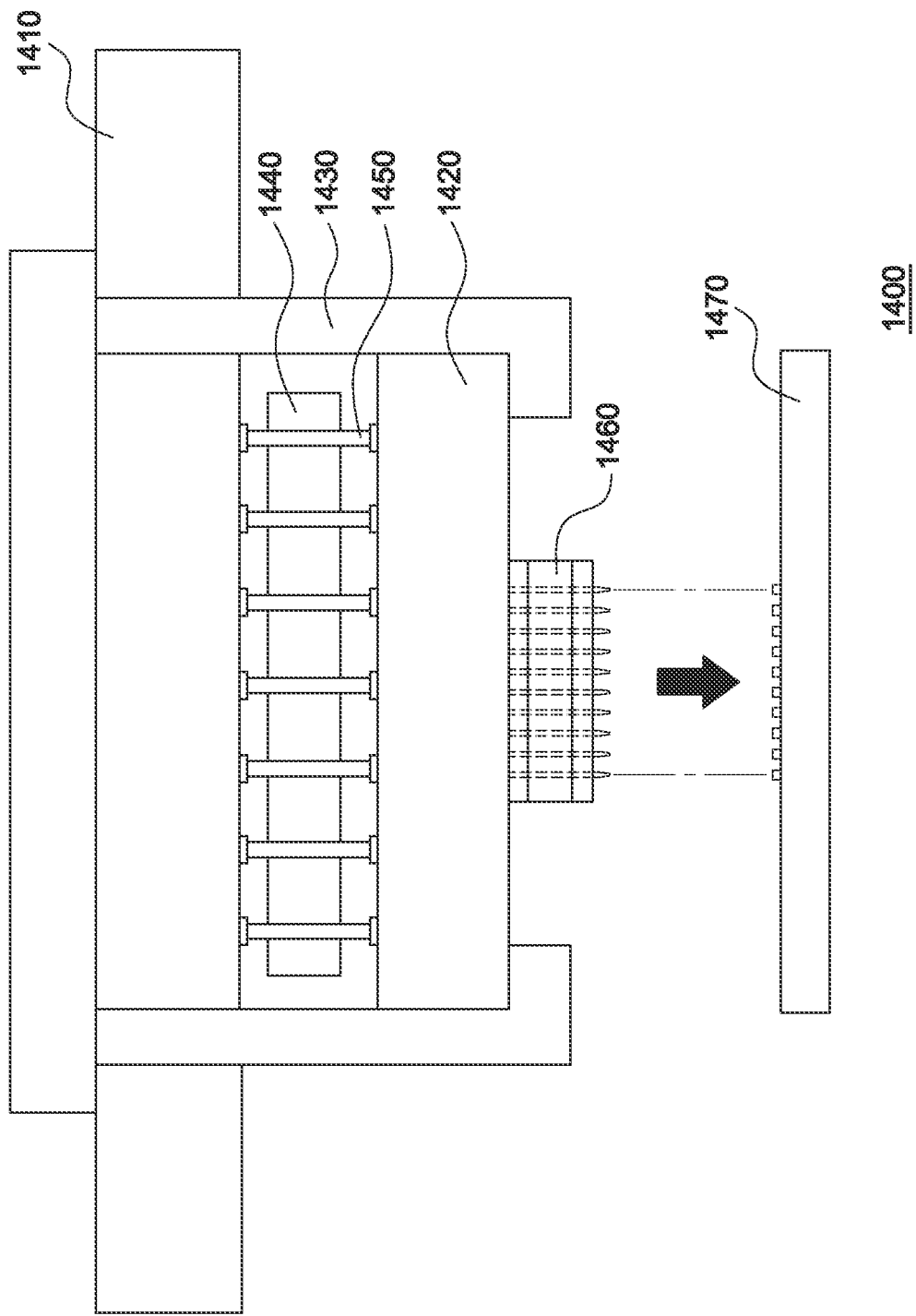
FIG. 1C is a schematic diagram illustrating the structure of another conventional probe test device of the prior art.
Figure 2:
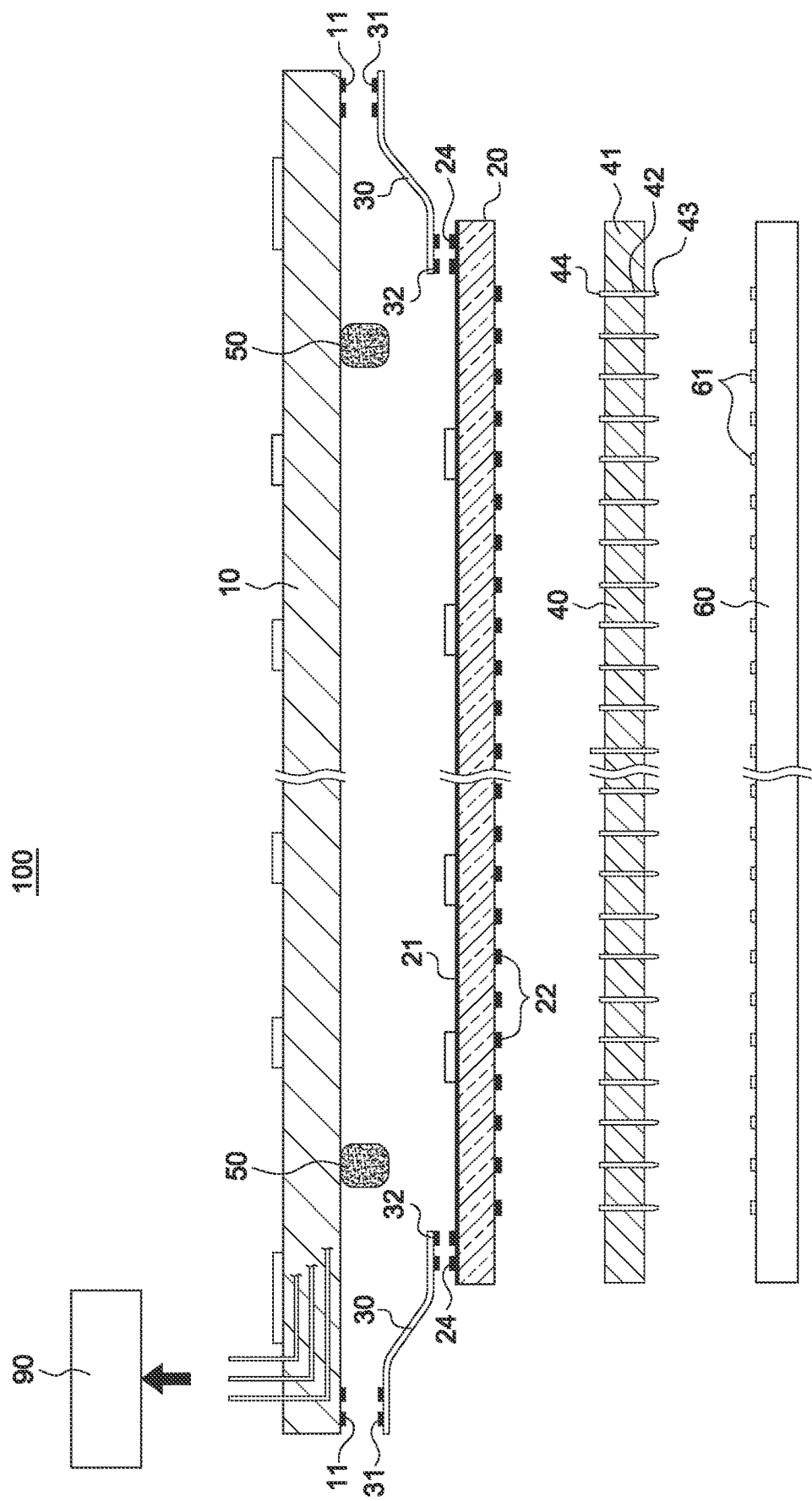
FIG. 2 is a schematic diagram illustrating the structure of the composite intermediary device of the first embodiment of the present invention.

Referring to FIG. 2, the composite intermediary device 100 of the first embodiment of the present invention includes: a printed circuit board 10, having a testing circuit (not shown in the drawing), for connecting to a measuring apparatus 90, the bottom of the printed circuit board 10 has a first contact 11, the first contact point 11 is divided into two sets, which are symmetrically arranged on the left and right sides; a glass interposer 20 arranged below the printed circuit board 10, the upper surface of the glass interposer 20 has a printed circuit 21, the lower surface has multiple contact pads 22, multiple through holes (not shown in the drawing) set through the upper surface and the lower surface, and the through holes are filled with a conductive material, so as to electrically connect the printed circuit 21 and the contact pads 22, and the top of the glass interposer 20 is provided with a second contact 24 which connects with the printed circuit 21, the second contact 24 is divided into two sets, which are symmetrically arranged on the left and right sides; Since the surface of the glass interposer 20 is printed with a printed circuit 21 which electric current can flow through, and the longitudinal section of the glass interposer 20 is processed with a plurality of through holes and filled with conductive materials, it is a known technology, so its principle and processing method I won't go into details here.

Moreover, at least one flexible connecting plate 30, the flexible connecting plate 30 is divided into two sets, which are symmetrically arranged on the left and right sides; one end has a top connecting end 31 to connect the first contact 11, the other end has a bottom connecting end 32 to connect the second contact 24, between the top connecting end 31 and the bottom connecting end 32 have multiple transmission lines (not shown in the drawing), so as to make the first contact 11 and the second contact 24 connect to each other; a vertical probe set 40, the vertical probe set 40 has a guide plate 41, the guide plate 41 having multiple via holes 42 for arranging the probes 43, and top end of each probe 43 has a salient point 44 to make contact to the contact pad 22 of the glass interposer 20 for having electric connection; and at least one buffer unit 50 made of insulating material, which is arranged between the printed circuit board 10 and the glass interposer 20, the buffer unit 50 is divided into two sets, which are symmetrically arranged on the left and right sides to block the contact between the printed circuit board 10 and the glass interposer 20; a device under test 60 of the present invention is supported by a work platform (not shown in the drawing), the top end of the device under test 60 has multiple bumps 61 arranged below the vertical probe set 40 for testing.

Figure 3A:
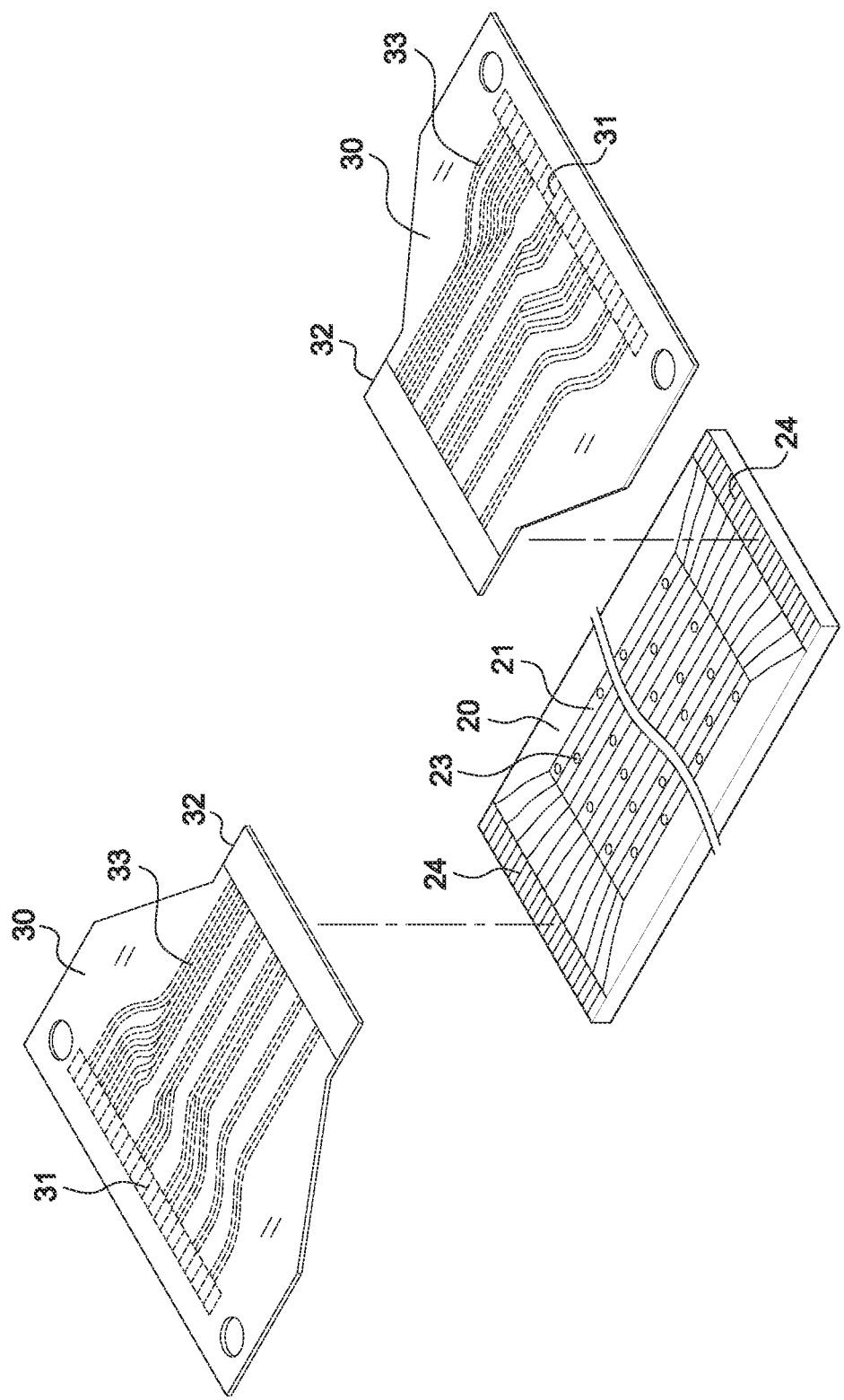
FIG. 3A is a top view of the unassembled state of the flexible connecting plate of the present invention.
Figure 3B:
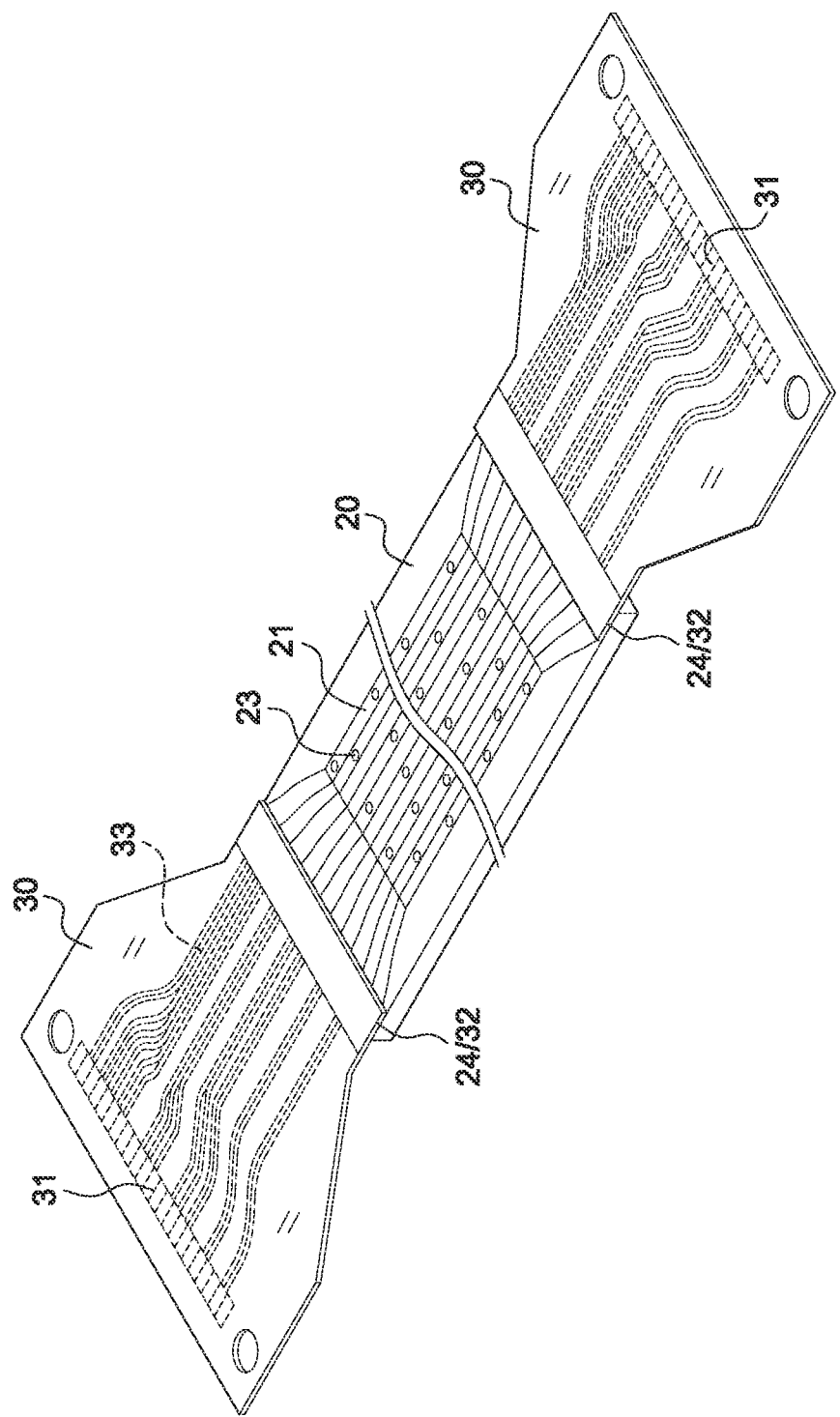
FIG. 3B is a top view of the flexible connecting plate of the present invention in connected status.
Figure 3C:
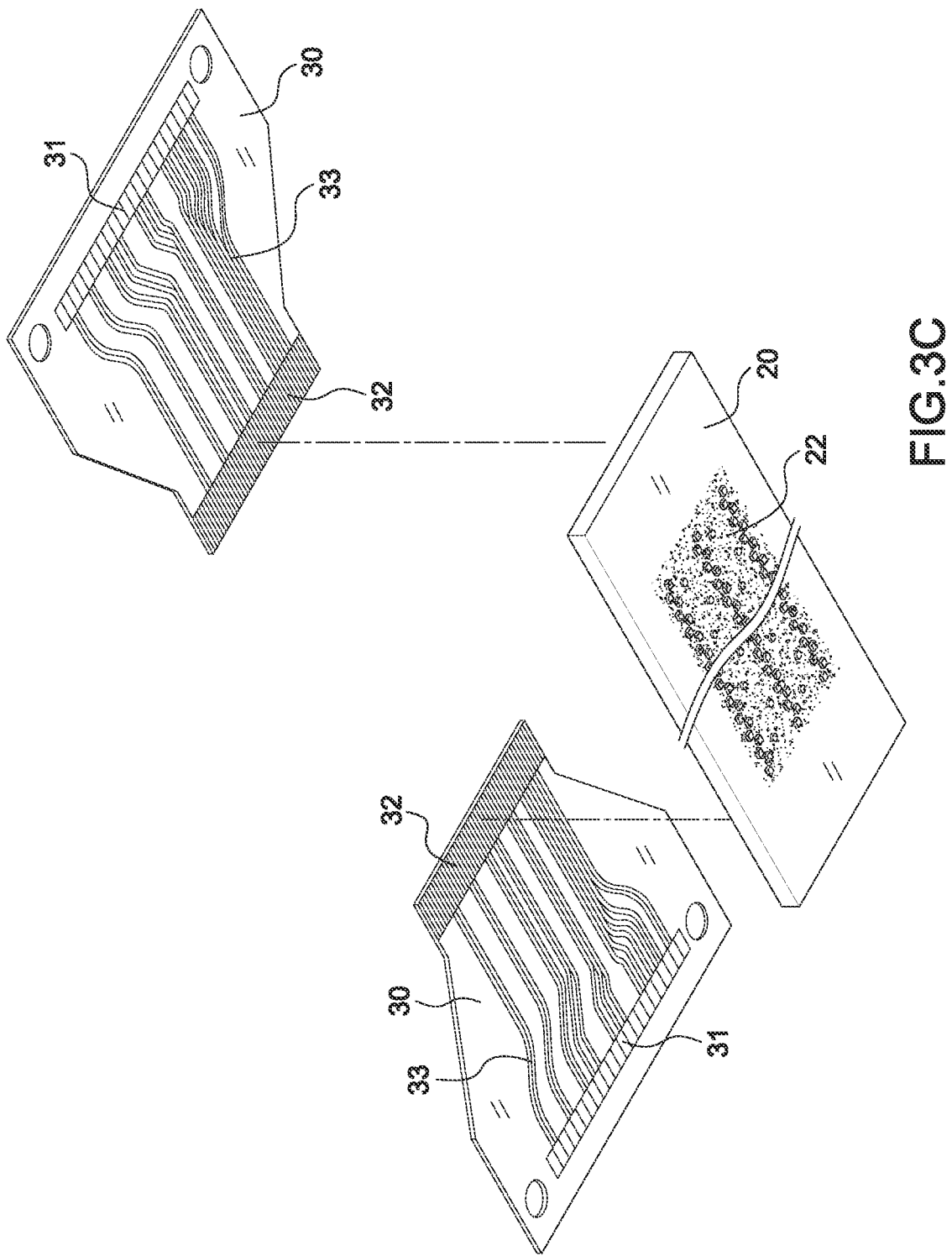
FIG. 3C is a bottom view of the unassembled state of the flexible connecting plate of the present invention.
Figure 3D:
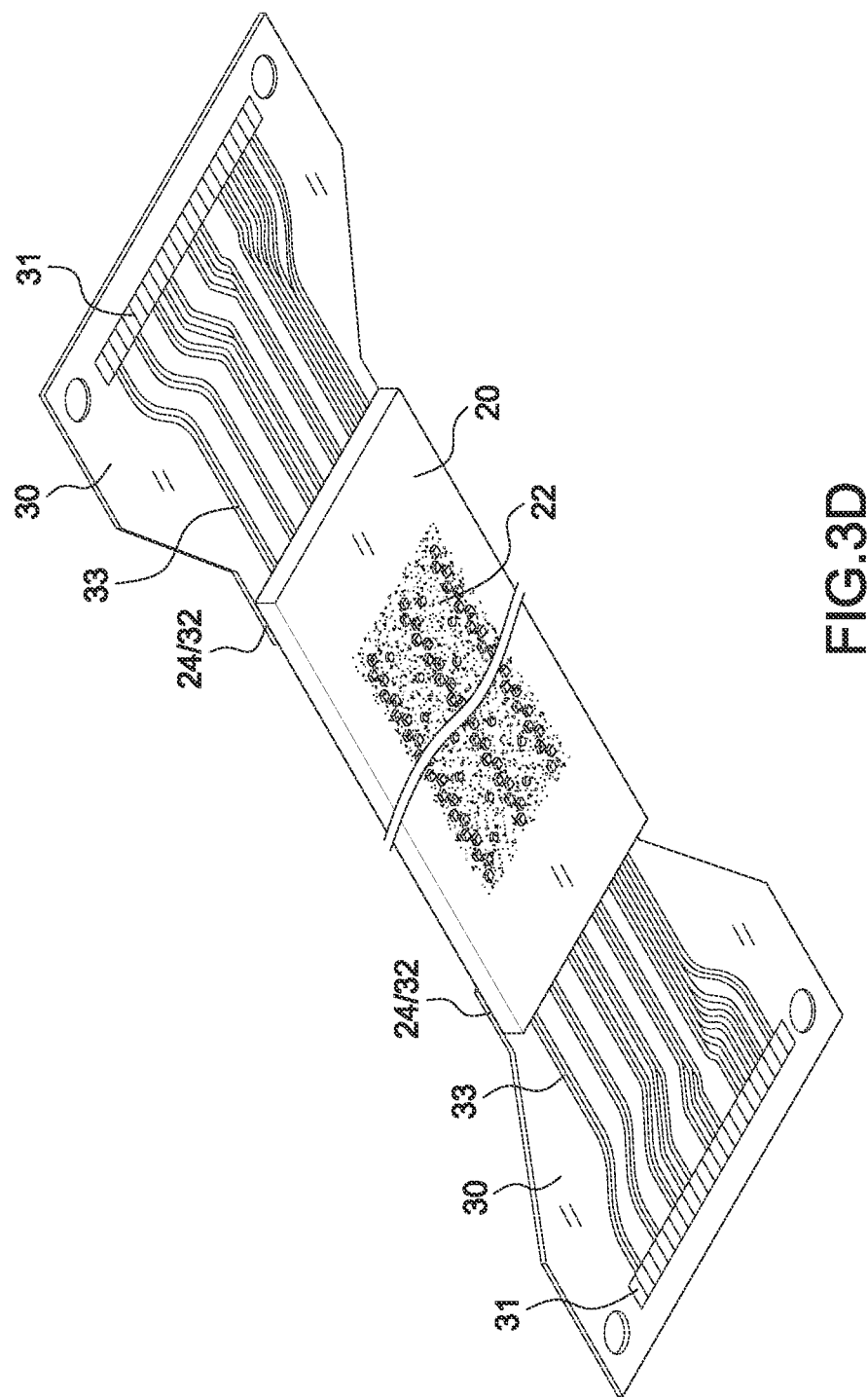
FIG. 3D is a bottom view of the flexible connecting plate of the present invention in connected status.

Referring to FIGS. 3A-3D, which are showing the electric connection of the flexible connecting plate 30 of the present invention, the upper surface of the glass interposer 20 has a printed circuit 21, the lower surface has multiple contact pads 22 and corresponds to the salient point 44 of the vertical probe set 40; since the printed circuit 21 and the contact pads 22 can achieve fine pitch configuration, and the printed circuit 21 and the contact pads 22 are electrically connected through the through holes 23 between them, the glass interposer 20 has the function of the space conversion. The two sets of the flexible connecting plate 30 are symmetrically arranged on the left and right sides; one end of the flexible connecting plate 30 has a top connecting end 31 to connect the first contact 11 of the printed circuit board 10, the other end has a bottom connecting end 32 to connect the second contact 24 of the glass interposer 20, between the top connecting end 31 and the bottom connecting end 32 have multiple transmission lines 33; FIG. 3A shows the top view of the unassembled state, and FIG. 3C shows the bottom view of the unassembled state; moreover, FIG. 3B shows the top view of the assembled circuit, and FIG. 3D shows the bottom view of the assembled circuit; The top connecting end 31 of the flexible connecting plate 30 is in contact with the first contact 11 of the printed circuit board 10, and the bottom connecting end 32 is in contact with the second contact 24 of the glass interposer 20, therefore, the flexible connecting plate 30 will make the first contact 11 and the second contact 24 connect to each other, which means that the circuit between the printed circuit board 10 and the glass interposer 20 is conducted.

Figure 4:
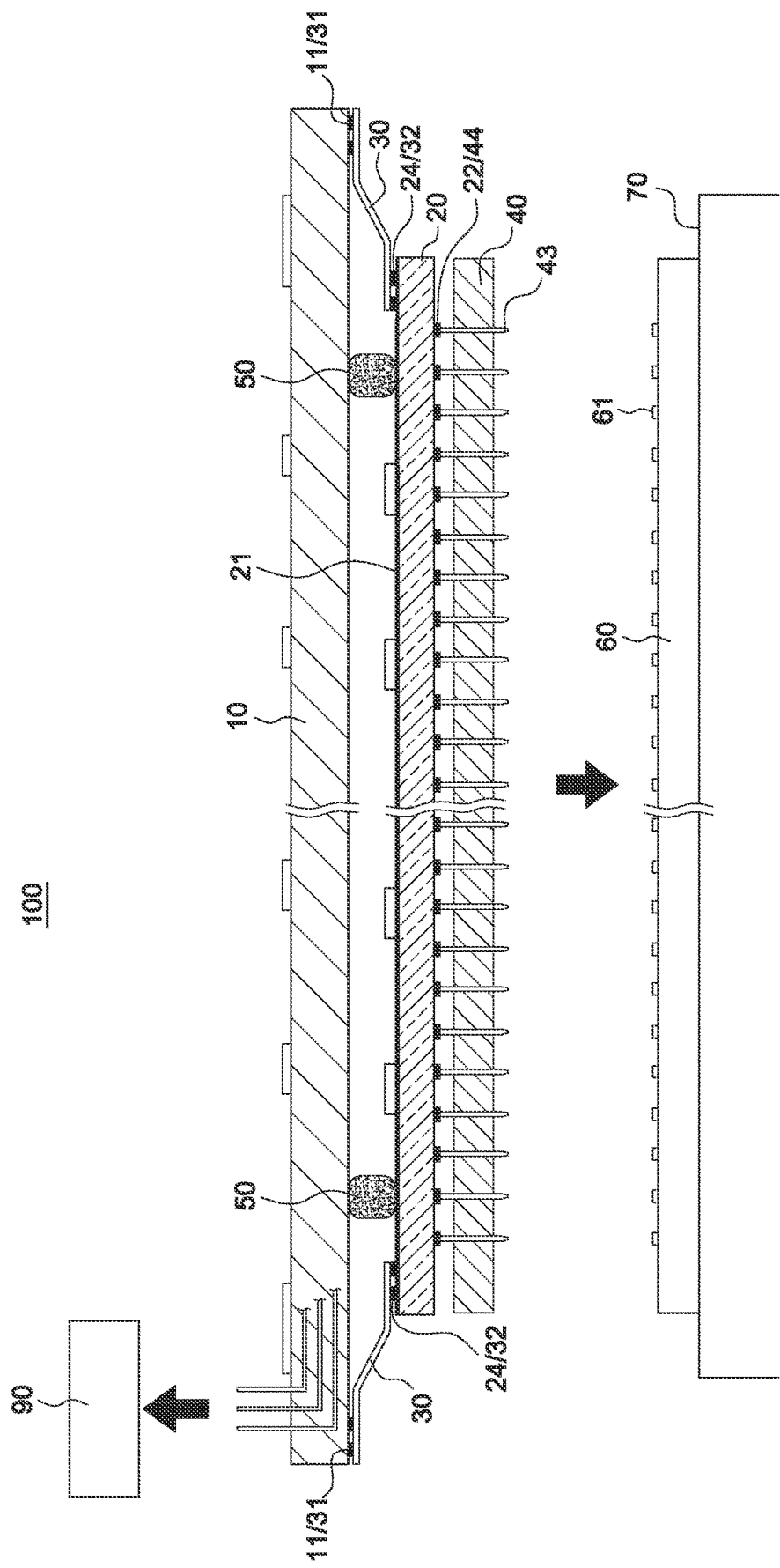
FIG. 4 is a schematic diagram illustrating the operation of the present invention.
Figure 5:
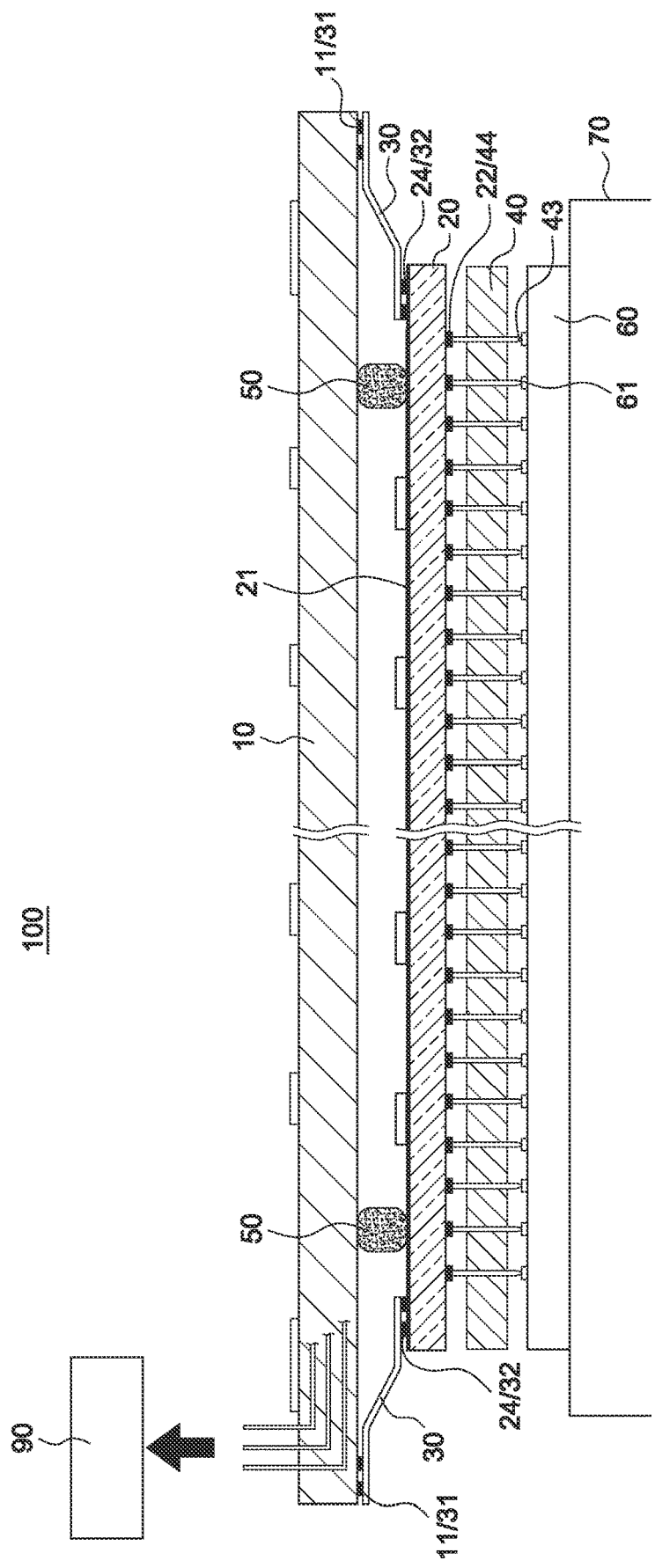
FIG. 5 is another schematic diagram illustrating the operation of the present invention.

Whereby during the wafer test, the composite intermediary device moves downward, the first contact 11 of the printed circuit board 10 will be in contact with the second contact 24 of the glass interposer 20 through the flexible connecting plate 30; moreover, the printed circuit 21 of the glass interposer 20 is electrically connected with the contact pads 22, and the multiple contact pads 22 of the glass interposer 20 are in contact with the salient points 44 of the multiple probes 43, as FIG. 4 showing; at this moment, the test circuit of the printed circuit board 10 is connected with the probes 43; the buffer units 50 are set between the printed circuit board 10 and the glass interposer 20, the buffer units 50 can insulate the connection between the printed circuit board 10 and the glass interposer 20 to avoid the happening of short circuit; the composite intermediary device 100 keeps moving downward, the probes 43 of the vertical probe set 40 against the bump 61 of the device under test 60 which arranged on the work platform 70, as FIG. 5 showing; at this moment, the measuring apparatus 90 sends a test signal, a test voltage entering the integrated circuit inside the device under test 60 by passing through the first contact 11 of the printed circuit board 10, the flexible connecting plate 30, the second contact 24 of the glass interposer 20, the printed circuit 21, the contact pads 22, the salient point 44 of the probes 43 and the bumps 61; after the test voltage is processed by the integrated circuit, the bumps 61 is fed back to the measuring apparatus 90 for analysis and judgment, then repeat the operation to achieve the test operation of the device under test 60.

Figure 6:
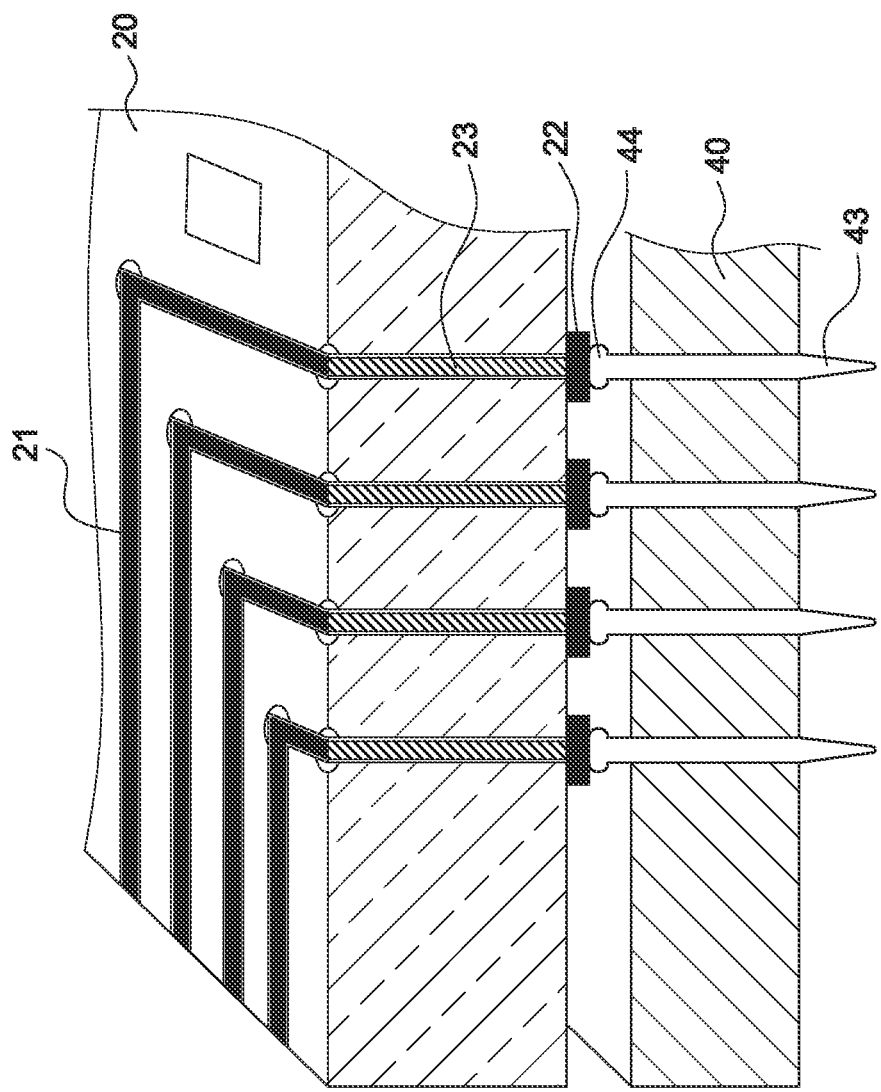
FIG. 6 is a schematic diagram illustrating the space conversion of the glass interposer of the present invention.

Referring to FIG. 6, which showing the space conversion of the glass interposer 20; wherein the upper surface of the glass interposer 20 has a printed circuit 21, the lower surface has multiple contact pads 22, since the printed circuit 21 and the contact pads 22 can achieve fine pitch configuration, and the printed circuit 21 and the contact pads 22 are electrically connected through the through holes 23 between them, and the printed circuit 21 of the looser circuit configuration corresponds to the test circuit of the printed circuit board 10, then the contact pads 22 of the tighter circuit configuration corresponds to the salient point 44 of the multiple probes 43 in the vertical probe set 40; therefore, the glass interposer 20 has the function of the space conversion.

Figure 7:
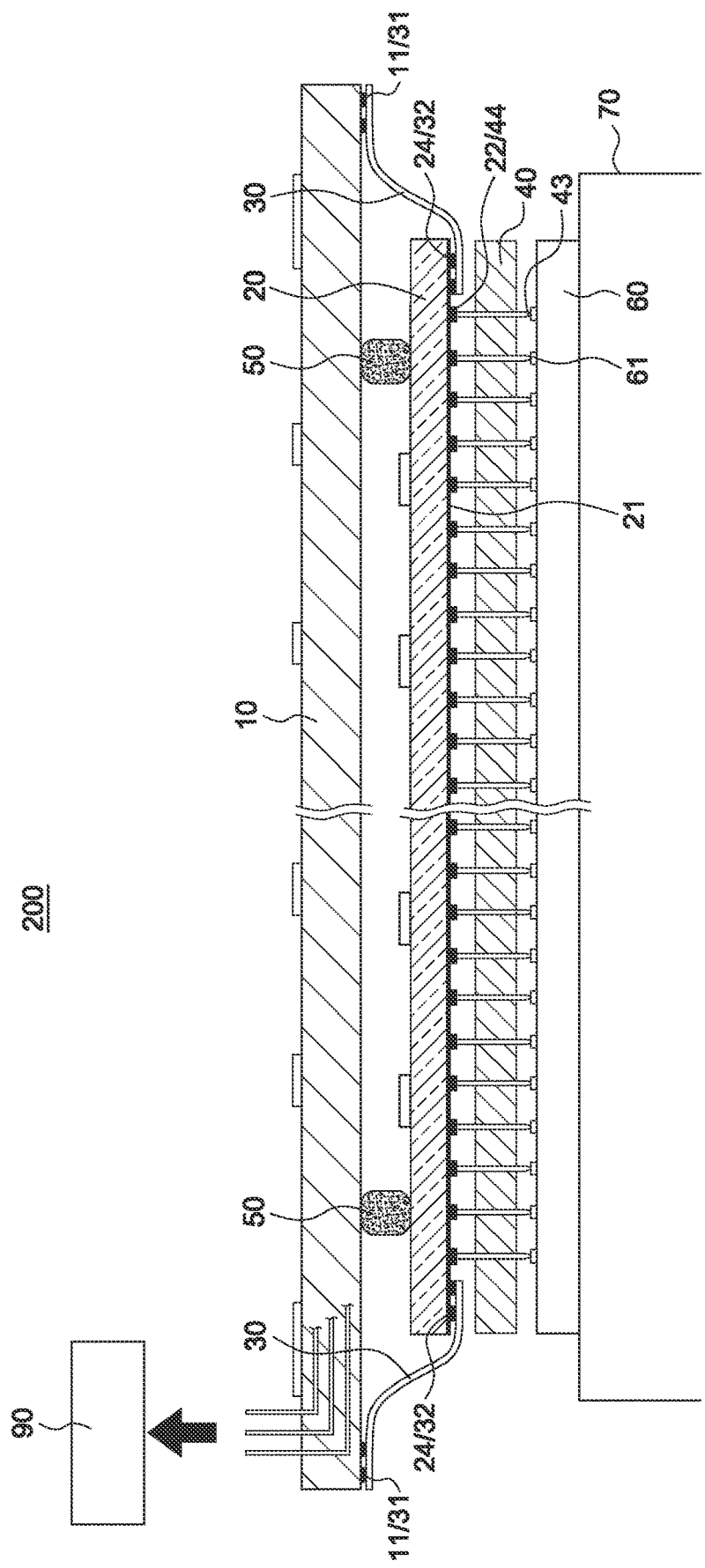
FIG. 7 is a schematic diagram illustrating the structure of the composite intermediary device of the second embodiment of the present invention.

Referring to FIG. 7, the composite intermediary device 200 of the second embodiment of the present invention includes: a printed circuit board 10, having a testing circuit (not shown in the drawing), for connecting to a measuring apparatus 90, the bottom of the printed circuit board 10 has a first contact 11, the first contact point 11 is divided into two sets, which are symmetrically arranged on the left and right sides; a glass interposer 20 arranged below the printed circuit board 10, the lower surface of the glass interposer 20 has printed circuits electrically connected to each other and multiple contact pads 22, and the bottom of the printed circuit board 10 is provided with a second contact 24 which connects with the printed circuit 21; at least one flexible connecting plate 30, the flexible connecting plate 30 is divided into two sets, which are symmetrically arranged on the left and right sides; one end has a top connecting end 31 to connect the first contact 11, the other end has a bottom connecting end 32 to connect the second contact 24, between the top connecting end 31 and the bottom connecting end 32 have multiple transmission lines, so as to make the first contact 11 and the second contact 24 connect to each other; a vertical probe set 40, the vertical probe set 40 has a guide plate 41, the guide plate 41 having multiple via holes 42 for arranging the probes 43, and top end of each probe 43 has a salient point 44 to make contact to the contact pad 22 of the glass interposer 20 for having electric connection; and at least one buffer unit 50 made of insulating material, which is arranged between the printed circuit board 10 and the glass interposer 20, the buffer unit 50 is divided into two sets, which are symmetrically arranged on the left and right sides to block the contact between the printed circuit board 10 and the glass interposer 20; a device under test 60 of the present invention is supported by a work platform 70, the top end of the device under test 60 has multiple bumps 61 arranged below the vertical probe set 40 for testing.

Figure 8B:
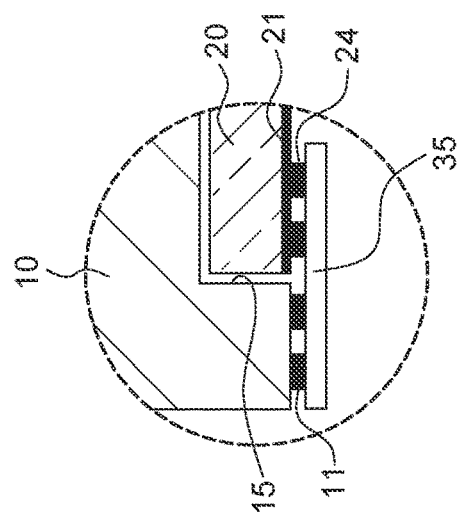
FIG. 8B is a zoom-in of the first join type of the present invention.
Figure 8A:
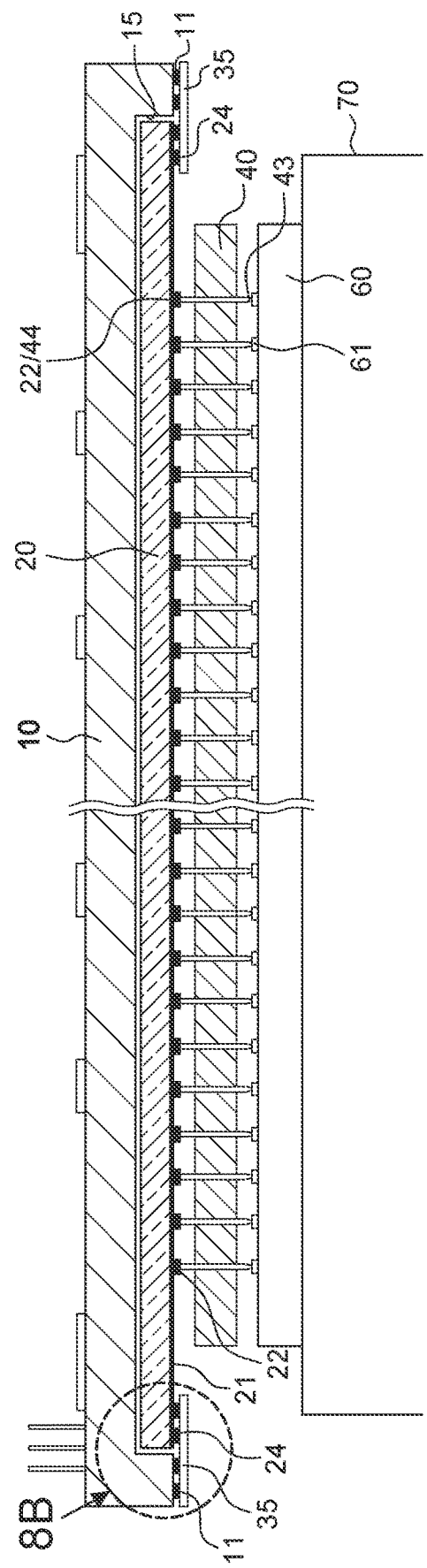
FIG. 8A is a schematic diagram illustrating the first joint type of the third embodiment of the present invention
Figure 10B:
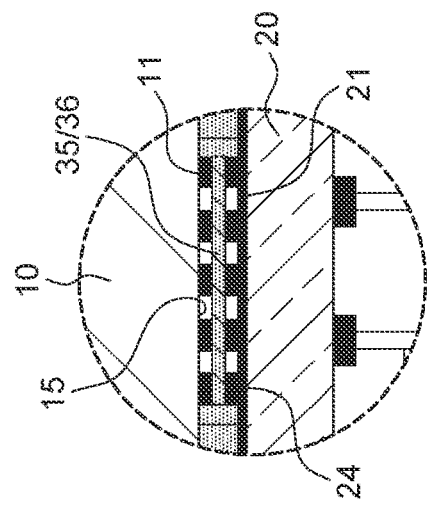
FIG. 10B is a zoom-in of the third join type of the present invention.
Figure 10A:
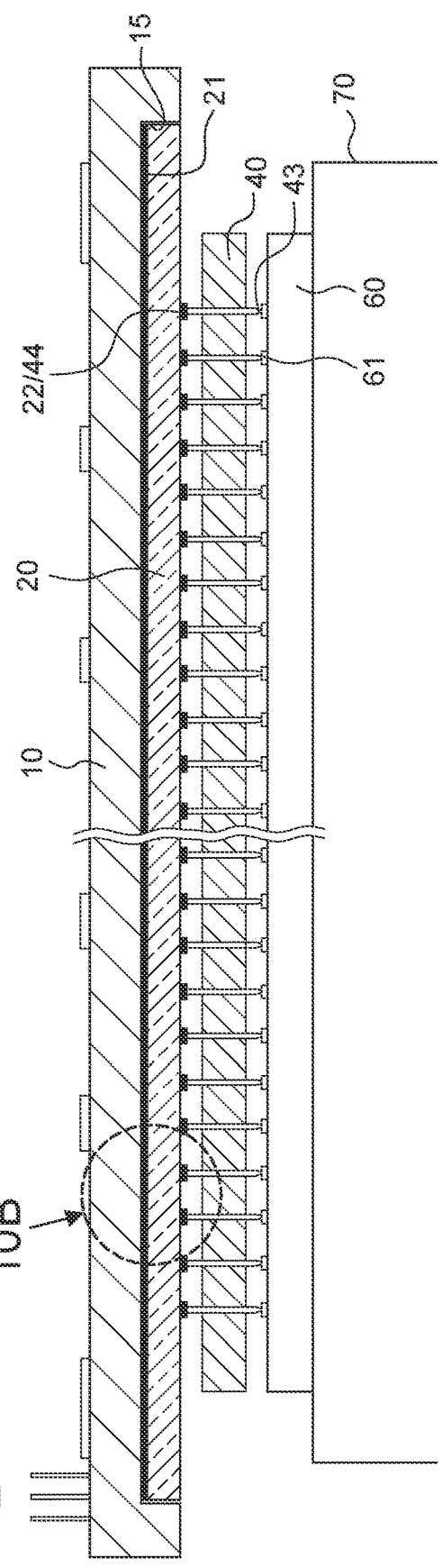
FIG. 10A is a schematic diagram illustrating the third joint type of the third embodiment of the present invention.

Referring to FIGS. 8A, 9A and 10A, the composite intermediary device 300 of the third embodiment of the present invention includes: a printed circuit board 10, having a testing circuit (not shown in the drawing), for connecting to a measuring apparatus 90, the bottom of the printed circuit board 10 has a groove 15 and a first contact 11, the first contact point 11 is divided into two sets, which are symmetrically arranged on the left and right sides; a glass interposer 20 arranged in the groove 15 of the printed circuit board 10, the surface of the glass interposer 20 has a printed circuit 21 and multiple contact pads 22, and the glass interposer 20 is provided with a second contact 24 which connects with the printed circuit 21, and the second contact 24 is connected to the first contact 11; a vertical probe set 40 has a guide plate 41, the guide plate 41 having multiple via holes 42 for arranging the probes 43, and top end of each probe 43 has a salient point 44 in contact with the contact pads 22 to make electrically connection; a device under test 60 is supported by a work platform 70, the top end of the device under test 60 has multiple bumps 61 arranged below the vertical probe set 40 for testing.

Moreover, there are three contact types of the first contact 11 and the second contact 24 of the third embodiment, the first contact type is as FIGS. 8A and 8B showing; wherein the printed circuit 21 and the multiple contact pads 22 are arranged on the lower surface of the glass interposer 20, the first contact 11 is arranged at the bottom of the printed circuit board 10 adjacent to the groove 15, the second contact 24 is arranged at the bottom of the glass interposer 20 corresponding to the first contact 11, and the first contact 11 and the second contact 24 are electrically connected by coating a solder paste or an anisotropic conductive adhesive film 35; then the second contact type is as FIGS. 9A and 9B showing, wherein the printed circuit 21 and multiple contact pads 22 are arranged at the lower surface of the glass interposer 20, the first contact 11 is arranged at one side of the groove 15 of the printed circuit board 10, the second contact 24 corresponds to the first contact 11 arranged at the lateral side of the glass interposer 20, and the first contact 11 and the second contact 24 are joined by laser welding; then the third contact type is as FIGS. 10A and 10B showing, wherein the printed circuit 21 and multiple contact pads 22 are respectively arranged on the upper surface and the lower surface of the glass interposer 20, multiple through holes set through the upper surface and the lower surface, and the through holes are filled with a conductive material, so as to electrically connect the printed circuit 21 and the contact pads 22, the first contact 11 is arranged on the top of the groove 15 of the printed circuit board 10, the second contact 24 is arranged on the top of the glass interposer 20 corresponding to the first contact 11, and the first contact 11 and the second contact 24 are electrically connected by coating a solder paste or an anisotropic conductive adhesive film 35 and laser welding 36.

In the composite intermediary device of the present invention, there are a printed circuit board 10, a glass interposer 20, and a vertical probe set 40 in sequence from top to bottom; wherein the glass interposer 20 has multiple contact pads 22 arranged at the bottom, the number and the positions of the contact pads 22 corresponds to the number of probes 43, and the number and the positions of the probes 43 correspond to the bumps 61 of the DUT 60; when doing the test, the composite intermediary device moves downward, and the plurality of probes 43 of the vertical probe set 40 will touch the bumps 61 of the DUT 60; at this time, the measuring apparatus 90 will send a test voltage enters the integrated circuit inside the DUT 60 by passing through the first contact 11, the second contact 24, the printed circuit 21, the contact pads 22, the probes 43 and bumps 61. After the test voltage is processed by the integrated circuit, it is fed back to the measuring apparatus 90 for analysis and judgment, then repeat the operation to achieve the test operation of the DUT 60; by a fine pitch configuration of the printed circuit 21 and the contact pads 22 of the glass interposer 20, the present invention achieves the requirements of synchronous and interleaved testing of multiple ICs.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A composite intermediary device using vertical probe for wafer testing, comprising:
    a printed circuit board, having a testing circuit, for connecting to a measuring apparatus, the bottom of the printed circuit board has a first contact;
    a glass interposer arranged below the printed circuit board, the upper surface of the glass interposer has a printed circuit, the lower surface has multiple contact pads, multiple through holes set through the upper surface and the lower surface, and the through holes are filled with a conductive material, so as to electrically connect the printed circuit and the contact pads, and top of the glass interposer is provided with a second contact which connects with the printed circuit;
    at least one flexible connecting plate, one end has a top connecting end to connect the first contact, the other end has a bottom connecting end to connect the second contact, between the top connecting end and the bottom connecting end have multiple transmission lines; and
    a vertical probe set secured below the glass interposer, the vertical probe set has a guide plate, the guide plate having multiple via holes for arranging probes, and top end of each probe has a salient point connect to a contact pad.

2. The composite intermediary device using vertical probe for wafer testing as claimed in claim 1, wherein further includes a buffer unit made of insulating material, which is arranged between the printed circuit board and the glass interposer to block a contact between the printed circuit board and the glass interposer.

3. A composite intermediary device using vertical probe for wafer testing, comprising:
    a printed circuit board, having a testing circuit, for connecting to a measuring apparatus, the bottom of the printed circuit board has a first contact;
    a glass interposer arranged below the printed circuit board, the lower surface of the glass interposer has printed circuits electrically connected to each other and multiple contact pads, and the bottom of the printed circuit board is provided with a second contact which connects with the printed circuit;
    at least one flexible connecting plate, one end has a top connecting end to connect the first contact, the other end has a bottom connecting end to connect the second contact, between the top connecting end and the bottom connecting end have multiple transmission lines; and
    a vertical probe set secured below the glass interposer, the vertical probe set has a guide plate, the guide plate having multiple via holes for arranging probes, and top end of each probe has a salient point connect to a contact pad.

4. The composite intermediary device using vertical probe for wafer testing as claimed in claim 3, wherein further includes a buffer unit made of insulating material, which is arranged between the printed circuit board and the glass interposer to block contact between the printed circuit board and the glass interposer.

5. A composite intermediary device using vertical probe for wafer testing, comprising:
    a printed circuit board, having a testing circuit, for connecting to a measuring apparatus, the bottom of the printed circuit board has a groove and a first contact;

a glass interposer arranged in the groove of the printed circuit board, a surface of the glass interposer has printed circuits electrically connected to each other and multiple contact pads, and the glass interposer is provided with a second contact which connects with the printed circuit, and the second contact is connected to the first contact;

a vertical probe set secured below the glass interposer, the vertical probe set has a guide plate, the guide plate having multiple via holes for arranging probes, and top end of each probe has a salient point connect to a contact pad.

6. The composite intermediary device using vertical probe for wafer testing as claimed in claim 5, wherein the printed circuit and multiple contact pads are arranged at the lower surface of the glass interposer, the first contact is arranged at one side of the groove of the printed circuit board, the second contact corresponds to the first contact arranged at a lateral side of the glass interposer, and the first contact and the second contact are joined by laser welding.

7. The composite intermediary device using vertical probe for wafer testing as claimed in claim 5, wherein the printed circuit and multiple contact pads are arranged on the lower surface of the glass interposer, and the first contact is arranged at the bottom of the printed circuit board adjacent to the groove, the second contact is arranged at the bottom of the glass interposer corresponding to the first contact, and the first contact and the second contact are electrically connected by coating a solder paste or an anisotropic conductive adhesive film.

8. The composite intermediary device using vertical probe for wafer testing as claimed in claim 5, wherein the printed circuit and multiple contact pads are respectively arranged on the upper surface and the lower surface of the glass interposer, multiple through holes set through the upper surface and the lower surface, and the through holes are filled with a conductive material, so as to electrically connect the printed circuit and the contact pads, the first contact is arranged on the top of the groove of the printed circuit board, the second contact is arranged on the top of the glass interposer corresponding to the first contact, and the first contact and the second contact are electrically connected by coating a solder paste or an anisotropic conductive adhesive film and laser welding.

\* \* \* \* \*